US012672350B2

(12) United States Patent (10) Patent No.: US 12,672,350 B2
Luo (45) Date of Patent: Jun. 30, 2026

(54) ARRAY SUBSTRATE, MANUFACTURING METHOD THEREOF, AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Chuanbao Luo, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 656 days.

(21) Appl. No.: 18/087,408

(22) Filed: Dec. 22, 2022

(65) Prior Publication Data

US 2024/0072068 A1 Feb. 29, 2024

(30) Foreign Application Priority Data

Aug. 30, 2022 (CN) .......................... 202211049294.8

(51) Int. Cl.
 *H10D 86/40* (2025.01)
 *H10D 86/01* (2025.01)
 *H10W 90/00* (2026.01)
(52) U.S. Cl.
 CPC ....... *H10D 86/441* (2025.01); *H10D 86/0231* (2025.01); *H10D 86/423* (2025.01); *H10W 90/00* (2026.01)

(58) Field of Classification Search
 CPC .............. H10D 86/441; H10D 86/423; H10D 30/6729; H01L 25/167
 See application file for complete search history.

(56) References Cited

U.S. PATENT DOCUMENTS

2001/0007362 A1* 7/2001 Ha ........................ H10D 86/441
 257/154
2008/0035930 A1* 2/2008 Nishiura .............. H10D 86/441
 257/72

(Continued)

FOREIGN PATENT DOCUMENTS

CN 104332477 A 2/2015
CN 111446295 A 7/2020
CN 113437090 A 9/2021

OTHER PUBLICATIONS

Chinese Office Action issued in corresponding Chinese Patent Application No. 202211049294.8 dated Apr. 26, 2025, pp. 1-8, 18pp.

*Primary Examiner* — Peter M Albrecht
(74) *Attorney, Agent, or Firm* — The Roy Gross Law Firm, LLC; Roy D. Gross

(57) ABSTRACT

An array substrate is manufactured by five time patterning processes and includes connecting electrodes. The connecting electrodes include a first connecting electrode and a second connecting electrode. The first connecting electrode is in contact with the source electrode contact area through the first contact hole and in contact with the source electrode through the third contact hole. The second connecting electrode is in contact with the drain electrode contact area through the second contact hole, and in contact with the drain electrode through the fourth contact hole.

15 Claims, 7 Drawing Sheets

(56)                    References Cited

U.S. PATENT DOCUMENTS

| | | | |
|---|---|---|---|
| 2022/0139970 A1* | 5/2022 | Kim ..................... | H10D 86/441 |
| | | | 257/72 |
| 2023/0028565 A1* | 1/2023 | Xu ....................... | H10D 86/441 |
| 2024/0030223 A1* | 1/2024 | Lu ....................... | H10D 86/441 |

* cited by examiner

100

200

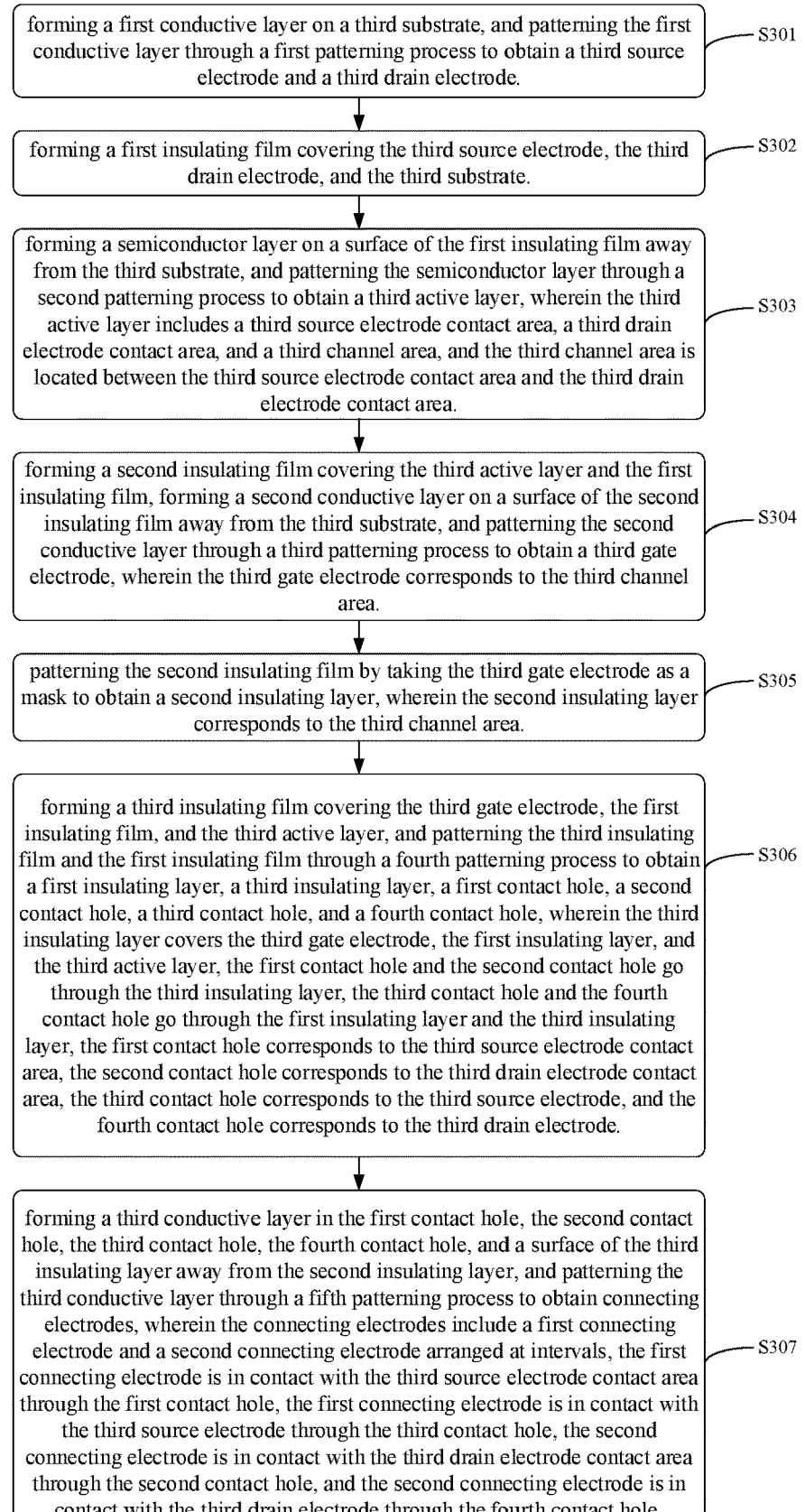

forming a first conductive layer on a third substrate, and patterning the first conductive layer through a first patterning process to obtain a third source electrode and a third drain electrode. ⟋—S301 forming a first insulating film covering the third source electrode, the third drain electrode, and the third substrate. ⟋—S302 forming a semiconductor layer on a surface of the first insulating film away from the third substrate, and patterning the semiconductor layer through a second patterning process to obtain a third active layer, wherein the third active layer includes a third source electrode contact area, a third drain electrode contact area, and a third channel area, and the third channel area is located between the third source electrode contact area and the third drain electrode contact area. ⟋—S303 forming a second insulating film covering the third active layer and the first insulating film, forming a second conductive layer on a surface of the second insulating film away from the third substrate, and patterning the second conductive layer through a third patterning process to obtain a third gate electrode, wherein the third gate electrode corresponds to the third channel area. ⟋—S304 patterning the second insulating film by taking the third gate electrode as a mask to obtain a second insulating layer, wherein the second insulating layer corresponds to the third channel area. ⟋—S305 forming a third insulating film covering the third gate electrode, the first insulating film, and the third active layer, and patterning the third insulating film and the first insulating film through a fourth patterning process to obtain a first insulating layer, a third insulating layer, a first contact hole, a second contact hole, a third contact hole, and a fourth contact hole, wherein the third insulating layer covers the third gate electrode, the first insulating layer, and the third active layer, the first contact hole and the second contact hole go through the third insulating layer, the third contact hole and the fourth contact hole go through the first insulating layer and the third insulating layer, the first contact hole corresponds to the third source electrode contact area, the second contact hole corresponds to the third drain electrode contact area, the third contact hole corresponds to the third source electrode, and the fourth contact hole corresponds to the third drain electrode. ⟋—S306 forming a third conductive layer in the first contact hole, the second contact hole, the third contact hole, the fourth contact hole, and a surface of the third insulating layer away from the second insulating layer, and patterning the third conductive layer through a fifth patterning process to obtain connecting electrodes, wherein the connecting electrodes include a first connecting electrode and a second connecting electrode arranged at intervals, the first connecting electrode is in contact with the third source electrode contact area through the first contact hole, the first connecting electrode is in contact with the third source electrode through the third contact hole, the second connecting electrode is in contact with the third drain electrode contact area through the second contact hole, and the second connecting electrode is in contact with the third drain electrode through the fourth contact hole. ⟋—S307

ARRAY SUBSTRATE, MANUFACTURING METHOD THEREOF, AND DISPLAY PANEL

CROSS REFERENCE TO RELATED APPLICATIONS

This application claims the benefit of priority of Chinese Application No. 202211049294.8 filed on Aug. 30, 2022. The contents of the above applications are all incorporated by reference as if fully set forth herein in their entirety.

FIELD OF INVENTION

The present disclosure relates to a field of display technology, and particularly relates to an array substrate, a manufacturing method thereof, and display panel.

BACKGROUND OF INVENTION

Oxide semiconductor array substrates are widely used because of higher mobility. However, manufacturing the oxide semiconductor array substrates requires more masks, resulting in higher cost of manufacturing the oxide semiconductor array substrates.

Therefore, how to reduce a number of the masks for manufacturing the oxide semiconductor array substrates is a technical problem to be solved.

SUMMARY

A purpose of the present disclosure is to provide an array substrate, a manufacturing method thereof, and a display panel to reduce a number of masks required for manufacturing the array substrate.

The present disclosure provides an array substrate, including:

a substrate;

a source electrode and a drain electrode arranged on a surface of the substrate;

a first insulating layer covering the source electrode, the drain electrode, and the substrate;

an active layer arranged on a surface of the first insulating layer away from the source electrode and the drain electrode, wherein the active layer includes a source electrode contact area, a drain electrode contact area, and a channel area, and the channel area is located between the source electrode contact area and the drain electrode contact area;

a second insulating layer arranged on a surface of the active layer away from the first insulating layer and corresponding to the channel area;

a gate electrode arranged on a surface of the second insulating layer away from the active layer and corresponding to the channel area;

a third insulating layer covering the first insulating layer and the gate electrode;

a first contact hole and a second contact hole defined through the third insulating layer, wherein the first contact hole corresponds to the source electrode contact area, and the second contact hole corresponds to the drain electrode contact area;

a third contact hole and a fourth contact hole defined through the third insulating layer and the first insulating layer, wherein the third contact hole corresponds to the source electrode, and the fourth contact hole corresponds to the drain electrode; and connecting electrodes including a first connecting electrode and a second connecting electrode arranged at intervals, wherein the first connecting electrode is in contact with the source electrode contact area through the first contact hole, the first connecting electrode is in contact with the source electrode through the third contact hole, the second connecting electrode is in contact with the drain electrode contact area through the second contact hole, and the second connecting electrode is in contact with the drain electrode through the fourth contact hole.

In some embodiments of the present disclosure, a material of the connecting electrodes includes a metal oxide.

In some embodiments of the present disclosure, an orthographic projection of the gate electrode on the substrate is located within an orthographic projection of the second connecting electrode on the substrate.

In some embodiments of the present disclosure, an orthographic projection of the gate electrode on the substrate is located within an orthographic projection of the first connecting electrode on the substrate, and the first connecting electrode overlaps the drain electrode contact area.

In some embodiments of the present disclosure, a distance between an edge of the first connecting electrode adjacent to the second connecting electrode and the gate electrode is greater than 2 μm and is less than or equal to 5 μm.

In some embodiments of the present disclosure, a distance between an edge of the first connecting electrode adjacent to the second connecting electrode and an edge of the second connecting electrode adjacent to the first connecting electrode is greater than 0 μm and is less than or equal to 4 μm.

In some embodiments of the present disclosure, the source electrode corresponds to the active layer, and an orthographic projection of the active layer on the substrate is located within an orthographic projection of the source electrode on the substrate.

In some embodiments of the present disclosure, an opening size of the first contact hole is less than an opening size of the third contact hole, and an opening size of the second contact hole is less than an opening size of the fourth contact hole.

The present disclosure further provides a manufacturing method of an array substrate, including:

forming a first conductive layer on a substrate, and patterning the first conductive layer through a first patterning process to obtain a source electrode and a drain electrode;

forming a first insulating film covering the source electrode, the drain electrode, and the substrate;

forming a semiconductor layer on a surface of the first insulating film away from the substrate, and patterning the semiconductor layer through a second patterning process to obtain an active layer, wherein the active layer includes a source electrode contact area, a drain electrode contact area, and a channel area, the channel area is located between the source electrode contact area and the drain electrode contact area;

forming a second insulating film covering the active layer and the first insulating film, forming a second conductive layer on a surface of the second insulating film away from the substrate, and patterning the second conductive layer through a third patterning process to obtain a gate electrode, wherein the gate electrode corresponds to the channel area;

patterning the second insulating film by taking the gate electrode as a mask to obtain a second insulating layer, wherein the second insulating layer corresponds to the channel area;

forming a third insulating film covering the gate electrode, the first insulating film, and the active layer, and patterning the third insulating film and the first insulating film through a fourth patterning process to obtain a first insulating layer, a third insulating layer, a first contact hole, a second contact hole, a third contact hole, and a fourth contact hole, wherein the third insulating layer covers the gate electrode, the first insulating layer, and the active layer, the first contact hole and the second contact hole penetrate through the third insulating layer, the third contact hole and the fourth contact hole penetrate through the first insulating layer and the third insulating layer, the first contact hole corresponds to the source electrode contact area, the second contact hole corresponds to the drain electrode contact area, the third contact hole corresponds to the source electrode, and the fourth contact hole corresponds to the drain electrode; and forming a third conductive layer in the first contact hole, the second contact hole, the third contact hole, the fourth contact hole, and a surface of the third insulating layer away from the second insulating layer, and patterning the third conductive layer through a fifth patterning process to obtain connecting electrodes, wherein the connecting electrodes include a first connecting electrode and a second connecting electrode arranged at intervals, the first connecting electrode is in contact with the source electrode contact area through the first contact hole, the first connecting electrode is in contact with the source electrode through the third contact hole, the second connecting electrode is in contact with the drain electrode contact area through the second contact hole, and the second connecting electrode is in contact with the drain electrode through the fourth contact hole.

The present further disclosure provides a display panel, and the display panel includes one of the abovementioned array substrates.

BENEFICIAL EFFECTS

The present disclosure provides an array substrate, an manufacturing method thereof, and a display panel. The array substrate is manufactured by five time patterning processes. Comparing with traditional methods of manufacturing array substrates that require seven or eight masks, a quantity of masks required for manufacturing the array substrate of the present disclosure is reduced.

DESCRIPTION OF DRAWINGS

FIG. 3 is a flowchart of a manufacturing method of an array substrate in an embodiment of the present disclosure.

DETAILED DESCRIPTION OF EMBODIMENTS

The technical solutions in the embodiments of the present disclosure will be described clearly and completely hereafter with reference to the accompanying drawings. Apparently, the described embodiments are only a part but not all of embodiments of the present disclosure. All other embodiments obtained by persons of ordinary skill in the art based on the embodiments of the present disclosure without creative efforts shall fall within the protection scope of the present disclosure.

Figure 1:
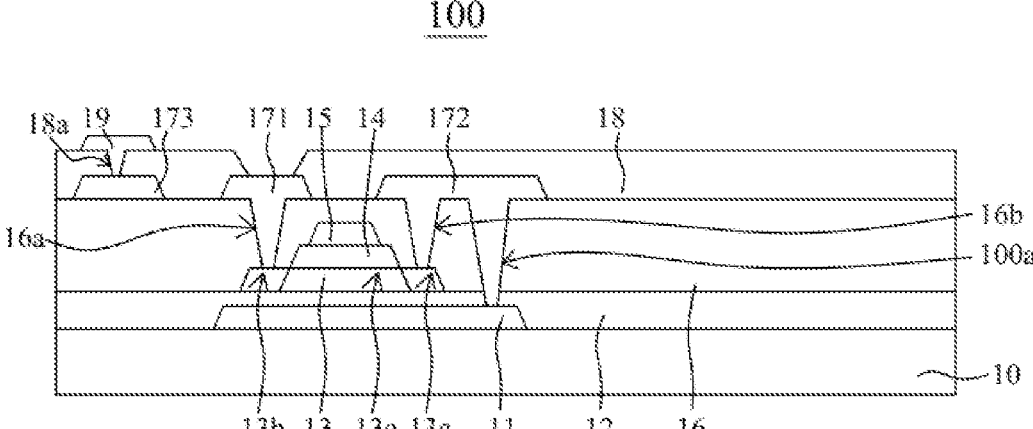
FIG. 1 is a first schematic diagram of an array substrate in traditional technology.

Referring to FIG. 1, FIG. 1 is a first schematic diagram of an array substrate in traditional technology The array substrate 100 includes a first substrate 10, a first light shading layer 11, a first buffer layer 12, a first active pattern 13, a first gate insulating layer 14, a first gate electrode 15, an interlayer insulating layer 16, a first source-drain electrode layer, a first passivation layer 18, and a first transparent conductive layer 19, which are sequentially stacked.

The first active pattern 13 corresponds to the first light shading layer 11. The first active pattern 13 includes a first channel area 13a, a first source electrode contact area 13b, and a first drain electrode contact area 13c. The first channel area 13a is located between the first source electrode contact area 13b and the first drain electrode contact area 13c. A material for manufacturing the first active pattern 13 includes indium gallium zinc oxide.

The first gate insulating layer 14 is located on a surface of the first active pattern 13 away from the first buffer layer 12, and the first gate insulating layer 14 corresponds to the first channel area 13a of the first active pattern 13.

The first gate electrode 15 is located on a surface of the first gate insulating layer 14 away from the first active pattern 13, and the first gate electrode 15 corresponds to the first channel area 13a of the first active pattern 13.

The first source-drain electrode layer includes a first source electrode 171, a first drain electrode 172, and a first conductive structure 173 arranged in a same layer. The first source electrode 171 is in contact with a part of the first active pattern 13 corresponding to the first source electrode contact area 13b through a first connecting hole 16a, and the first connecting hole 16a goes through the interlayer insulating layer 16. The first drain electrode 172 is in contact with a part of the first active pattern 13 corresponding to the first drain electrode contact area 13c through a second connecting hole 16b, and the second connecting hole 16b goes through the interlayer insulating layer 16. The first drain electrode 172 is connected to the first light shielding layer 11 through a third connecting hole 100a, and the third connecting hole 100a goes through the interlayer insulating layer 16 and the first buffer layer 12.

The first transparent conductive layer 19 corresponds to the first conductive structure 173, and the first transparent conductive layer 19 is connected to the first conductive structure 173 through a fourth connecting hole 18a. The fourth connecting hole 18a goes through the first passivation layer 18.

For the array substrate shown in FIG. 1, each step of providing the first light shading layer 11, providing the first active pattern 13, providing the first gate electrode 15, providing connecting holes in the first buffer layer 12, providing connecting holes in the interlayer insulating layer 16, providing the first source-drain electrode layer, providing connecting holes in the first passivation layer 18, and providing the first transparent conductive layer 19 requires an independent mask respectively. Therefore, manufacturing the array substrate shown in FIG. 1 requires a total of eight masks.

Figure 2:
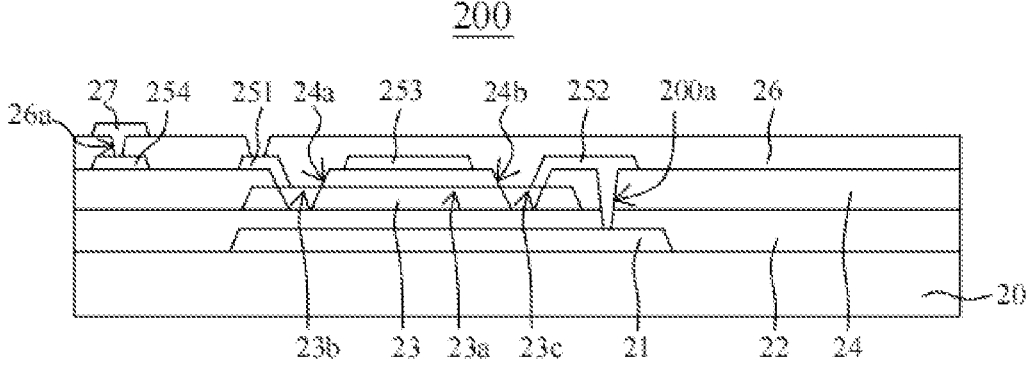
FIG. 2 is a second schematic diagram of the array substrate in the traditional technology.

Referring to FIG. 2, FIG. 2 is a second schematic diagram of an array substrate in the traditional technology. The array substrate 200 includes a second substrate 20, a second light shading layer 21, a second buffer layer 22, a second active pattern 23, a second gate insulating layer 24, a second source-drain electrode layer, a second passivation layer 26, and a second transparent conductive layer 27, which are sequentially stacked.

The second active pattern 23 corresponds to the second light shading layer 21. The second active pattern 23 includes a second channel area 23a, a second source electrode contact area 23b, and a second drain electrode contact area 23c. A material for manufacturing the second active pattern 23 includes indium gallium zinc oxide.

The second source-drain electrode layer includes a second source electrode 251, a second drain electrode 252, a second gate electrode 253, and a second conductive structure 254 arranged in a same layer. The second source electrode 251 is in contact with a part of the second active pattern 23 corresponding to the second source electrode contact area 23b through a fifth connecting hole 24a, and the fifth connecting hole 24a goes through the second gate insulating layer 24. The second drain electrode 252 is in contact with a part of the second active pattern 23 corresponding to the second drain electrode contact area 23c through a sixth connecting hole 24b, and the sixth connecting hole 24b goes through the second gate insulating layer 24. The second drain electrode 252 is further in contact with the second light shading layer 21 through a seventh connecting hole 200a, and the seventh connecting hole 200a goes through the second gate insulating layer 24 and the second buffer layer 22. The second gate electrode 253 corresponds to the second channel area 23a of the second active pattern 23.

The second transparent conductive layer 27 corresponds to the second conductive structure 254, the second transparent conductive layer 27 is in contact with the second conductive structure 254 through an eighth connecting hole 26a, and the eighth connecting hole 26a goes through the second passivation layer 26.

For the array substrate shown in FIG. 2, each step of providing the second light shading layer 21, providing the second active pattern 23, providing connecting holes in the second buffer layer 22, providing connecting holes in the second gate insulating layer 24, providing the second source-drain electrode layer, providing connecting holes in the second passivation layer 26, and providing the second transparent conductive layer 27 requires an independent mask respectively. Therefore, manufacturing the array substrate shown in FIG. 2 requires a total of seven masks.

In addition, in the array substrate shown in FIG. 2, the second gate insulating layer and the second passivation layer are arranged above the second active pattern. A thinner thickness of the second gate insulating layer and a thinner thickness of the second passivation layer result in a poor insulation ability to moisture and oxygen of the array substrate shown in FIG. 2. Furthermore, during a process of providing the connecting holes in the second gate insulating layer, and a process of providing the source electrode layer in FIG. 2, etching solutions used may contact the second active pattern. For one thing, the etching solutions may etch the second active pattern. For another thing, the etching solutions may result inion concentrations of In, Ga, and Zn on a surface of the second active pattern changed. Finally, stability and reliability of devices on the array substrate are ultimately affected.

Referring to FIG. 3, FIG. 3 is a flowchart of a manufacturing method of an array substrate in an embodiment of the present disclosure. The manufacturing method of the array substrate includes following steps:

Step S301, forming a first conductive layer on a third substrate, and patterning the first conductive layer through a first patterning process to obtain a third source electrode and a third drain electrode.

Figure 4A:
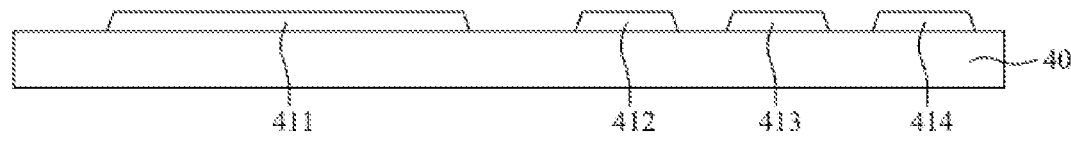
FIG. 4A-FIG. 4F are schematic diagrams showing a process of manufacturing the array substrate in an embodiment of the present disclosure.

In detail, the steps include: providing the first conductive layer on the third substrate 40 by physical sputtering deposition, coating a first photoresist layer on the first conductive layer, exposing the first photoresist layer with a first mask, developing the exposed first photoresist layer by a first developing solution, etching the first conductive layer uncovered by the first photoresist layer treated by the first developer solution, and removing the remaining first photoresist layer to obtain the third source electrode 411, the third drain electrode 412, a first conductive pad 413, and a second conductive pad 414 arranged at intervals from each other. The third source electrode 411 and the third drain electrode 412 are arranged adjacent to each other. The first conductive pad 413 and the second conductive pad 414 are arranged adjacent to each other. The third drain electrode 412 is arranged adjacent to and connected to the first conductive pad 413, as shown in FIG. 4A.

The third substrate 40 is a glass substrate or, in another embodiment, the third substrate 40 may be a flexible substrate.

A thickness of the first conductive layer is greater than or equal to 3000 angstroms and is less than or equal to 6500 angstroms, such as 3000 angstroms, 4000 angstroms, 5000 angstroms, 6000 angstroms, and 6500 angstroms. The first conductive layer is a metal layer, and a material for manufacturing the first conductive layer includes at least one selected from molybdenum, copper, aluminum, titanium, nickel, and silver.

Step S302, forming a first insulating film covering the third source electrode, the third drain electrode, and the third substrate.

Figure 4B:
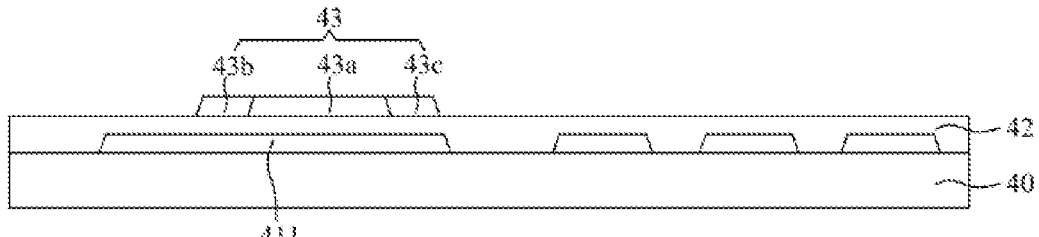

In detail, the steps include: forming the first insulating film 42 covering the third source electrode 411, the third drain electrode 412, the first conductive pad 413, the second conductive pad 414, and the third substrate 40 by chemical vapor deposition, and then annealing the first insulating film 42 in high-temperature, wherein a temperature of the high-temperature annealing treatment ranges from 300° C. to 400° C. for 2 hours to 3 hours, as shown in FIG. 4B.

It should be noted that the third source electrode 411 and the third drain electrode 412 are covered by the first insulating film 42, which is beneficial to prevent the third source electrode 411 and the third drain electrode 412 from being oxidized during the high-temperature annealing step of the first insulating film 42.

A thickness of the first insulating film 42 is greater than or equal to 3000 angstroms and is less than or equal to 5000 angstroms, such as 3000 angstroms, 4000 angstroms, and 5000 angstroms. The first insulating film 42 is an inorganic insulating film, and a material for manufacturing the first insulating film 42 includes at least one selected from silicon nitride and silicon oxide.

Step S303, forming a semiconductor layer on a surface of the first insulating film away from the third substrate, and patterning the semiconductor layer through a second patterning process to obtain a third active layer, wherein the third active layer includes a third source electrode contact area, a third drain electrode contact area, and a third channel area, and the third channel area is located between the third source electrode contact area and the third drain electrode contact area.

A thickness of the semiconductor layer is greater than or equal to 300 angstroms and is less than or equal to 600 angstroms, such as 300 angstroms, 400 angstroms, 500 angstroms, and 600 angstroms. A material for manufacturing the semiconductor layer includes a metal oxide, and the metal oxide includes at least one selected from indium gallium zinc oxide, indium gallium zinc tin oxide, and indium gallium tin oxide. Further, it can be understood that the material for manufacturing the semiconductor layer may be polysilicon or amorphous silicon.

In detail, the steps include: forming the semiconductor layer on the surface of the first insulating film 42 away from the third substrate 40 by physical vapor deposition technology with indium gallium zinc oxide target, forming a second photoresist layer on the semiconductor layer, exposing the second photoresist layer with a second mask, developing the exposed second photoresist layer with a second developing solution, etching the semiconductor layer uncovered by the second photoresist layer treated by the second developer solution, and removing the remaining second photoresist layer to obtain the third active layer 43. The third active layer 43 corresponds to the third source electrode 411. The third active layer 43 includes the third source electrode contact area 43b, the third drain electrode contact area 43c, and the third channel area 43a. The third channel area 43a is located between the third source electrode contact area 43b and the third drain electrode contact area 43c, as shown in FIG. 4B.

In the embodiment, an orthographic projection of the third active layer 43 on the third substrate 40 is located within an orthographic projection of the third source electrode 411 on the third substrate 40, so that the third source electrode 411 may completely cover the third active layer 43. When light is incident from a side of the third substrate 40 away from the third source electrode 411 toward the third active layer 43, the light irradiates the third source electrode 411 and reflects from the third source electrode 411 to irradiate the side of the third substrate 40 away from the third source electrode 411 without irradiating the third active layer 43, thereby influence of the light on the third active layer 43 is reduced. That is, the third source electrode 411 is further used as a light shielding layer.

Step S304, forming a second insulating film covering the third active layer and the first insulating film, forming a second conductive layer on a surface of the second insulating film away from the third substrate, and patterning the second conductive layer through a third patterning process to obtain a third gate electrode, wherein the third gate electrode corresponds to the third channel area.

A thickness of the second insulating film 44 is greater than or equal to 1000 angstroms and is less than or equal to 2500 angstroms, such as 1000 angstroms, 1500 angstroms, 1800 angstroms, and 2000 angstroms. The second insulating film 44 is also an inorganic insulating film, and a material for manufacturing the second insulating film 44 includes at least one selected from silicon nitride and silicon oxide.

A thickness of the second conductive layer is greater than or equal to 1800 angstroms and is less than or equal to 5000 angstroms, such as 1800 angstroms, 2000 angstroms, 3000 angstroms, 4000 angstroms, and 5000 angstroms. The second conductive layer is a metal layer, and a material for manufacturing the second conductive layer includes at least one selected from molybdenum, aluminum, titanium, copper, and silver.

Figure 4C:
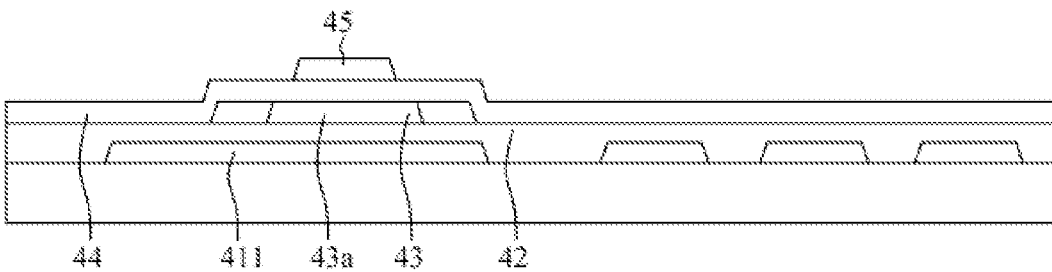

In detail, the steps include: forming the second insulating film 44, covering the third active layer 43 and the first insulating film 42 by chemical vapor deposition, and forming the second conductive layer on the surface of the second insulating film 44 away from the third substrate 40 by the physical vapor deposition, coating a third photoresist layer on the second conductive layer, exposing the third photoresist layer with a third mask, developing the exposed third photoresist layer with a third developing solution, etching the second conductive layer uncovered by the third photoresist layer treated by the third developer solution, and removing the remaining third photoresist layer to obtain the third gate electrode 45. The third gate electrode 45 corresponds to the third channel area 43a, as shown in FIG. 4C.

In the embodiment, an orthographic projection of the third gate electrode 45 on the third substrate 40 is exactly overlapped with an orthographic projection of the third channel area 43a of the third active layer 43, and correspondingly, an area of the third gate electrode 45 is equal to an area of the third channel area 43a of the third active layer 43.

Step S305, patterning the second insulating film by taking the third gate electrode as a mask to obtain a second insulating layer, wherein the second insulating layer corresponds to the third channel area.

Figure 4D:
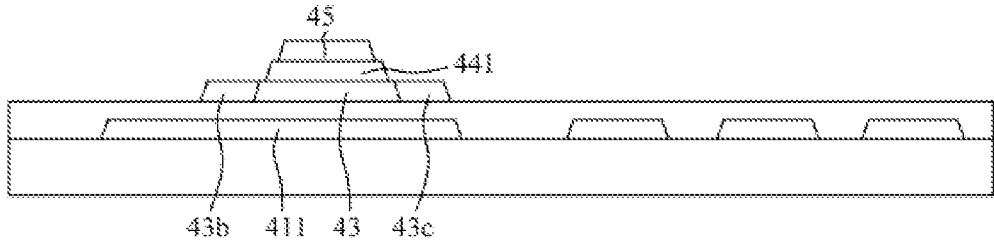

In detail, the steps include: by taking the third gate electrode 45 as the mask, etching the second insulating film 44 not covered by the third gate electrode 45 to obtain the second insulating layer 441, as shown in FIG. 4D, and doping the third source electrode contact area 43b and the third drain electrode contact area 43c of the third active layer 43 with ions Step S306, forming a third insulating film covering the third gate electrode, the first insulating film, and the third active layer, and patterning the third insulating film and the first insulating film through a fourth patterning process to obtain a first insulating layer, a third insulating layer, a first contact hole, a second contact hole, a third contact hole, and a fourth contact hole, wherein the third insulating layer covers the third gate electrode, the first insulating layer, and the third active layer, the first contact hole and the second contact hole go through the third insulating layer, the third contact hole and the fourth contact hole go through the first insulating layer and the third insulating layer, the first contact hole corresponds to the third source electrode contact area, the second contact hole corresponds to the third drain electrode contact area, the third contact hole corresponds to the third source electrode, and the fourth contact hole corresponds to the third drain electrode.

A thickness of the third insulating film is greater than or equal to 3000 angstroms and is less than or equal to 5000 angstroms, such as 3000 angstroms, 4000 angstroms, and 5000 angstroms. The third insulating film is an inorganic insulating layer, and a material for manufacturing the third insulating film includes at least one selected from silicon nitride and silicon oxide. For example, the third insulating film is a silicon oxide layer, or the third insulating film includes a silicon nitride layer located between two silicon oxide layers.

Figure 4E:
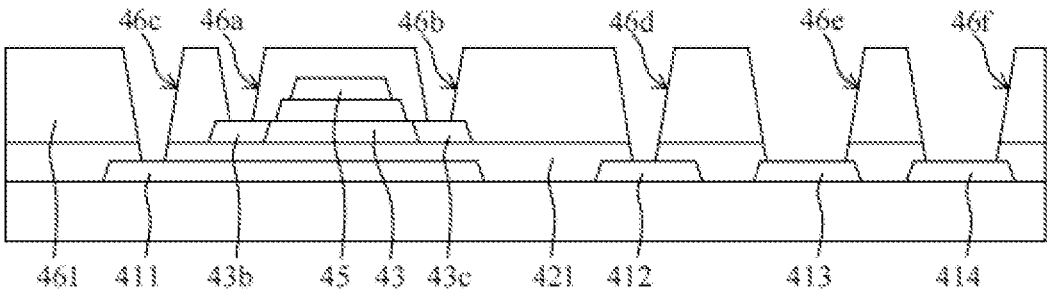
Figure 4F:
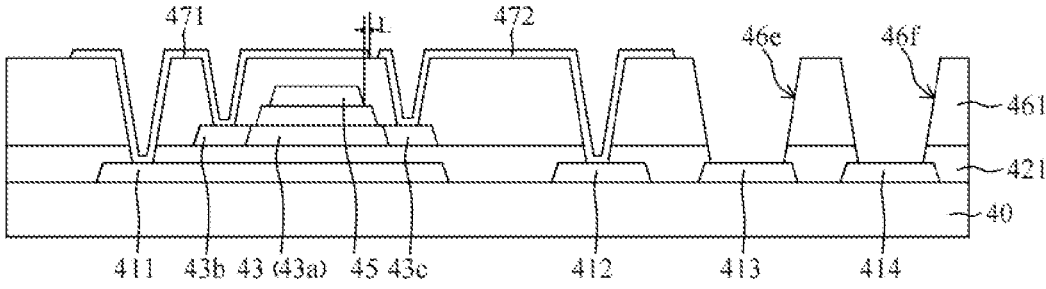

In detail, the steps include: forming the third insulating film covering the third gate electrode 45, the first insulating film 42, and the third active layer 43 by chemical vapor deposition, forming a fourth photoresist layer on the third insulating film, exposing the fourth photoresist layer with a fourth mask, developing the exposed fourth photoresist layer with a fourth developing solution, etching the third insulating film and the first insulating film 42 under the third insulating film uncovered by the fourth photoresist layer treated by the fourth developer solution to obtain a first insulating layer 421, a third insulating layer 461, a first contact hole 46a, a second contact hole 46b, a third contact hole 46c, a fourth contact hole 46d, a first opening 46e, and a second opening 46f. The third insulating layer 461 covers the third gate electrode 45, the first insulating layer 421, and the third active layer 43, as show in FIG. 4E.

The first contact hole 46a and the second contact hole 46b go through the third insulating layer 461. The first contact hole 46a corresponds to the third source electrode contact area 43b of the third active layer 43, and the second contact hole 46b corresponds to the drain electrode contact area 43c of the third active layer 43. An opening size of the first contact hole 46a is equal to an opening size of the second contact hole 46b.

Both the third contact hole 46c and the fourth contact hole 46d go through the third insulating layer 461 and the first insulating layer 421. The third contact hole 46c corresponds to the third source electrode 411, and the fourth contact hole 46d corresponds to the third drain electrode 412. An opening size of the third contact hole 46c is equal to an opening size of the fourth contact hole 46d.

The opening size of the first contact hole 46a is less than the opening size of the third contact hole 46c, and the opening size of the second contact hole 46b is less than the opening size of the fourth contact hole 46d, so as to avoid a problem of poor conductivity of the conductive layer formed subsequently in the third contact hole 46c and the fourth contact hole 46d.

Both the first opening 46e and the second opening 46f go through the third insulating layer 461 and the first insulating layer 421. The first opening 46e corresponds to the first conductive pad 413, and the second opening 46f corresponds to the second conductive pad 414.

Step S307, forming a third conductive layer in the first contact hole, the second contact hole, the third contact hole, the fourth contact hole, and a surface of the third insulating layer away from the second insulating layer, and patterning the third conductive layer through a fifth patterning process to obtain connecting electrodes, wherein the connecting electrodes include a first connecting electrode and a second connecting electrode arranged at intervals, the first connecting electrode is in contact with the third source electrode contact area through the first contact hole, the first connecting electrode is in contact with the third source electrode through the third contact hole, the second connecting electrode is in contact with the third drain electrode contact area through the second contact hole, and the second connecting electrode is in contact with the third drain electrode through the fourth contact hole.

The third conductive layer is a transparent conductive layer. A thickness of the third conductive layer is greater than or equal to 400 angstroms and is less than or equal to 800 angstroms, such as 450 angstroms, 500 angstroms, 550 angstroms, 600 angstroms, 650 angstroms, 700 angstroms, 750 angstroms, and 800 angstroms. A material for manufacturing the third conductive layer is a metal oxide, and the metal oxide includes at least one selected from indium tin oxide and indium zinc oxide. Further, it can be understood that a material for manufacturing the third conductive layer may be a metal.

It should be noted that the material for manufacturing the third conductive layer is the metal oxide, so that the third conductive layer may be etched by wet etching. Because the wet etching has better selectivity, damages to the third insulating layer 461 may be avoided when the third conductive layer is etched, thereby improving a barrier ability of the third insulating layer 461 from water vapor and oxygen gas, and improving a problem that water vapor and oxygen gas may pass through the third insulating layer 461 and reach the third channel area 43a of the third active layer 43 to affect performance of the third active layer 43. Furthermore, because of advantages of the wet etching itself, etching the third conductive layer by wet etching is more conducive to reducing a minimum value of a gap between the first connecting electrode and the second connecting electrode. The third insulating layer 461 exposed by the gap between the first connection electrode and the second connection electrode is reduced, and less moisture and oxygen may pass through the third insulating layer 461 to reach the third channel area 43a of the third active layer 43, thereby further improving influence of the moisture and the oxygen on the performance of the third active layer 43.

When the material for manufacturing the third conductive layer is the metal, it is limited to include a metal material having good conductivity such as copper. The third conductive layer is generally etched by dry etching. Due to poor selectivity of the dry etching, the third insulating layer 461 may be damaged by dry etching. When the third insulating layer 461 is damaged, risks of the water vapor and the oxygen passing through the third insulating layer 461 and reaching the third channel area 43a of the third active layer 43 may be increased, thereby affecting the performance of the third active layer 43. Furthermore, when the material for manufacturing the third conductive layer is the metal, it is limited that the third conductive layer may only be patterned by dry etching, which results in that the minimum value of the gap between the first connecting electrode and the second connecting electrode formed by dry etching is greater than the minimum value of the gap between the first connecting electrode and the second connecting electrode formed by wet etching the third conductive layer composed of the metal oxide.

The first connecting electrode 471 is in contact with the third source electrode contact area 43b through the first contact hole 46a, and the first connecting electrode 471 is in contact with the third source electrode 411 through the third contact hole 46c. That is, the first connecting electrode 471 bridges the third source electrode contact area 43b of the third active layer 43 with the third source electrode 411.

The second connecting electrode 472 is in contact with the third drain electrode contact area 43c through the second contact hole 46b, and the second connecting electrode 472 is in contact with the third drain electrode 412 through the fourth contact hole 46d. That is, the second connecting electrode 472 bridges the third drain electrode contact area 43c with the third drain electrode 412.

The orthographic projection of the third gate electrode 45 on the third substrate 40 is located within an orthographic projection of the first connecting electrode 471 on the third substrate 40 or an orthographic projection of the second connecting electrode 472 on the third substrate 40, so that the first connecting electrode 471 or the second connecting electrode 472 overlaps a part of the third active layer 43 corresponding to the third channel area 43*a*. The first connecting electrode 471 or the second connecting electrode 472 blocks a diffusion of the water vapor in an environment to the third channel area 43*a* of the third active layer 43, which is conducive to improving stability of a threshold voltage of a thin film transistor including the third active layer 43, the third gate electrode 45, the third source electrode 411, the third drain electrode 412, etc.

Figure 8:
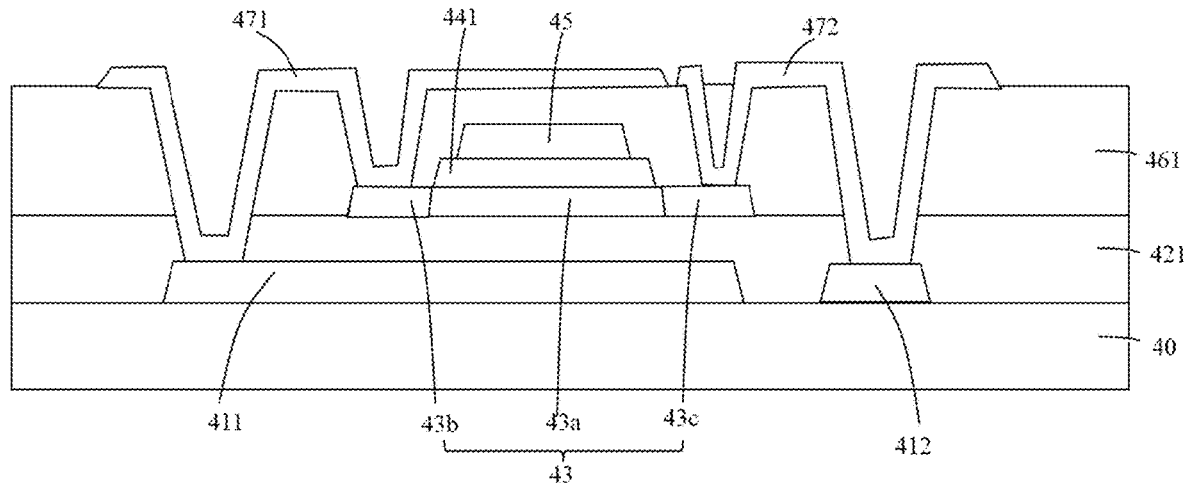
FIG. 8 is a schematic diagram of an array substrate according to some embodiments of the present disclosure.

Furthermore, please refer to FIG. 8, the orthographic projection of the third gate electrode 45 on the third substrate 40 is located within the orthographic projection of the first connecting electrode 471 on the third substrate 40, and the first connecting electrode 471 overlaps the third drain electrode contact area 43*c*. In other words, a part of the first connecting electrode 471 extends from the third source contact area 43*b* of the third active layer 43 through an upper part of the third channel area 43*a* of the third active layer 43 to an upper part of the third drain contact area 43*c* of the third active layer 43, so as to reduce the exposed third insulating layer between the first connecting electrode 471 and the second connecting electrode 472. Thereby the water vapor diffused from the exposed third insulating layer 461 between the first connecting electrode 471 and the second connecting electrode 472 to the third channel area 43*a* of the third active layer 43 is further reduced, and the stability of the threshold voltage of the thin film transistor is further improved. Furthermore, when the thin film transistor is working, a voltage connected to the third source 411 is less than a voltage connected to the third drain 412. So that a voltage connected to the first connecting electrode 471 is less than a voltage connected to the second connecting electrode 472. When the first connecting electrode 471 is overlapped with the third gate electrode 45, a parasitic capacitance between the first connecting electrode 471 and the third gate electrode 45 is lower.

It can be understood that the orthographic projection of the third gate electrode 45 on the third substrate 40 may be located within the orthographic projection of the second connecting electrode 472 on the third substrate 40 in another embodiment. A part of the second connecting electrode 472 extends from the third drain contact area 43*c* of the third active layer 43 through the upper part of the third channel area 43*a* of the third active layer 43 to an upper part of the third source contact area 43*b* of the third active layer 43.

In detail, a distance L between an edge of the first connecting electrode 471 adjacent to the second connecting electrode 472 and the third gate electrode 45 is greater than 2 μm and is less than or equal to 5 μm so as to reduce the exposed third insulating layer 461 between the first connecting electrode 471 and the second connecting electrode 472. For example, the distance L between the edge of the first connecting electrode 471 adjacent to the second connecting electrode 472 and the third gate electrode 45 is 2 μm, 3 μm, 4 μm, or 5 μm.

Figure 5:
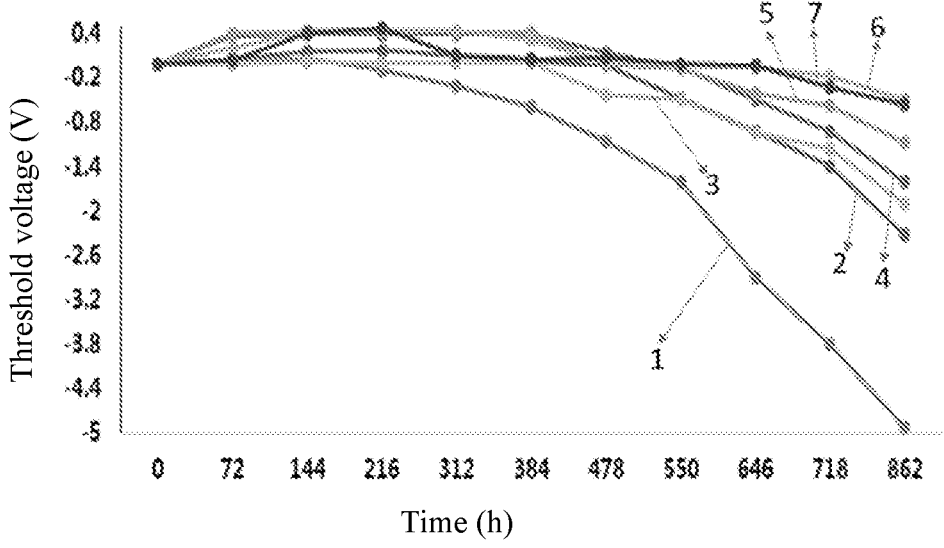
FIG. 5 is a schematic curves of threshold voltage of a thin film transistor to time in conditions that a distance L between an edge of a first connecting electrode adjacent to a second connecting electrode and a third gate electrode is 0 μm, greater than 0 μm and less than or equal to 1 μm, greater than 1 μm and less than or equal to 2 μm, greater than 2 μm and less than or equal to 3 μm, greater than 3 μm and less than or equal to 4 μm, and greater than 4 μm and less than or equal to 5 μm, and in conditions that neither the first connecting electrode nor the second connecting electrode are overlapped with the third gate electrode.

Referring to FIG. 5, FIG. 5 is a schematic curves of threshold voltage of the thin film transistor to time in conditions that the distance L between the edge of the first connecting electrode adjacent to the second connecting electrode and the third gate electrode is 0 μm, greater than 0 μm and less than or equal to 1 μm, greater than 1 μm and less than or equal to 2 μm, greater than 2 μm and less than or equal to 3 μm, greater than 3 μm and less than or equal to 4 μm, and greater than 4 μm and less than or equal to 5 μm, and in conditions that neither the first connecting electrode nor the second connecting electrode are not overlapped with the third gate electrode. Line 1 corresponds to the case that neither the first connecting electrode nor the second connecting electrode overlaps the third gate electrode, line 2 corresponds to the case that the distance L between the edge of the first connecting electrode adjacent to the second connecting electrode and the third gate electrode is 0 μm, line 3 corresponds to the case that the distance L between the edge of the first connecting electrode adjacent to the second connecting electrode and the third gate electrode is greater than 0 μm and is less than or equal to 1 μm, line 4 corresponds to the case that the distance L between the edge of the first connecting electrode adjacent to the second connecting electrode and the third gate electrode is greater than 1 μm and is less than or equal to 2 μm, line 5 corresponds to the case that the distance L between the edge of the first connecting electrode adjacent to the second connecting electrode and the third gate electrode is greater than 2 μm and is less than or equal to 3 μm, line 6 corresponds to the case that the distance L between the edge of the first connecting electrode adjacent to the second connecting electrode and the third gate electrode is greater than 3 μm and is less than or equal to 4 μm, and line 7 corresponds to the case that the distance L between the edge of the first connecting electrode adjacent to the second connecting electrode and the third gate electrode is greater than 4 μm and is less than or equal to 5 μm.

According to FIG. 5, when neither the first connecting electrode nor the second connecting electrode overlaps with the third gate electrode, that is, when the third insulating layer 461 above a part of the third active layer 43 corresponding to the third channel area 43*a* is not shielded, the threshold voltage of the thin film transistor decreases significantly with time. However, as the distance L between the edge of the first connecting electrode adjacent to the second connecting electrode and the third gate electrode increases gradually from greater than 0 μm, a magnitude of the threshold voltage drop of the thin film transistor decreases continuously with time. Particularly, when the distance L between the edge of the first connecting electrode adjacent to the second connecting electrode and the third gate electrode is greater than 2 μm and is less than or equal to 5 μm, the threshold voltage of the thin film transistor is in a relatively stable state with time, thereby the stability of the thin film transistor is improved.

A distance between an end of the first connecting electrode 471 adjacent to the second connecting electrode 472 and an end of the second connecting electrode 472 adjacent to the first connecting electrode 471 is greater than 0 μm and is less than or equal to 4 μm, such as 1 μm, 2 μm, 3 μm, and 4 μm.

Five masks are used in the manufacturing method of the array substrate in the embodiment to manufacture the array substrate, compared that seven masks or eight masks are required to manufacture an array substrate in traditional technology, more than two masks are saved in the manufacturing method of the array substrate in the embodiment of the present disclosure. Furthermore, in the manufacturing method of the array substrate in the embodiment of the present disclosure, when the second conductive layer is etched by a metal etching solution, the third active layer is covered by the second insulating film, the metal etching solution does not contact the third active layer, thereby avoiding an influence of the metal etching solution on the third active layer.

The present disclosure further provides a display panel 500. The display panel 500 may be any one of a liquid crystal display panel, an organic light-emitting diode display panel, a micro light-emitting diode display panel, and a mini light-emitting diode display panel. In detail, the embodiment of the present disclosure takes the display panel 500 as the micro light-emitting diode display panel for example.

Figure 6:
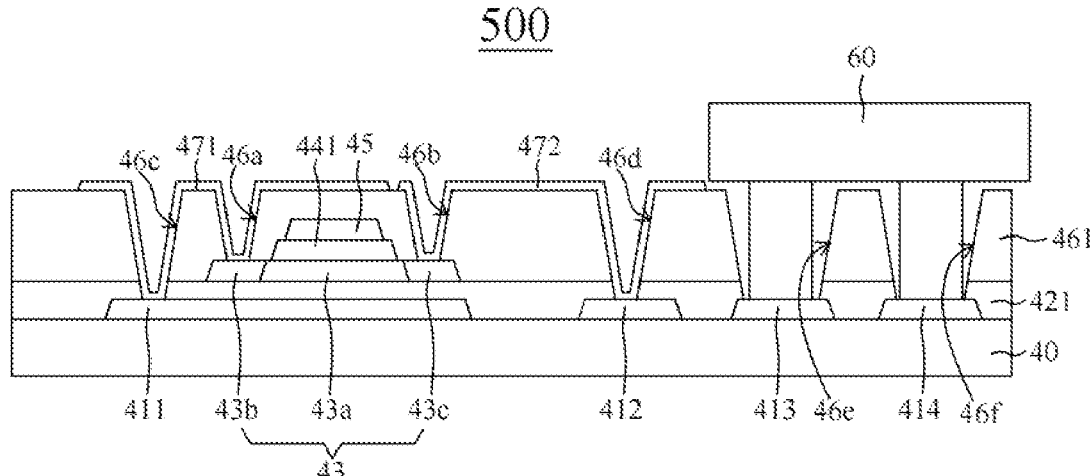
FIG. 6 is a schematic cross-sectional diagram of a display panel in an embodiment of the present disclosure.
Figure 7:
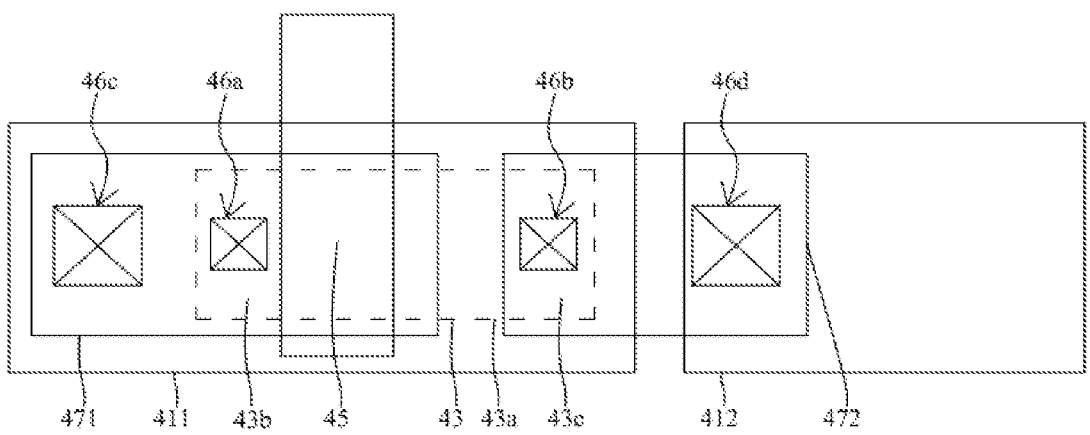
FIG. 7 is a schematic diagram of the display panel shown in FIG. 6.

Referring to FIG. 6 and FIG. 7, FIG. 6 is schematic cross-sectional diagram of a display panel in the embodiment of the present disclosure, FIG. 7 is a schematic diagram of the display panel shown in FIG. 6. The display panel 500 shown in FIG. 6 includes an array substrate and light-emitting devices 60.

The array substrate includes a third substrate 40, a third source electrode 411, a third drain electrode 412, a first conductive pad 413, a second conductive pad 414, a first insulating layer 421, a third active layer 43, a second insulating layer 441, a third gate electrode 45, a third insulating layer 461, a first contact hole 46a, a second contact hole 46b, a third contact hole 46c, a fourth contact hole 46d, a first opening 46e, a second opening 46f, and connecting electrodes.

The third source electrode 411, the third drain electrode 412, the first conductive pad 413, and the second conductive pad 414 are arranged at intervals on a surface of the third substrate 40. The third source electrode 411 is arranged adjacent to the third drain electrode 412. The first conductive pad 413 is arranged adjacent to the second conductive pad 414. The third drain electrode 412 is arranged adjacent to and connected to the first conductive pad 413.

The first insulating layer 421 covers the third source electrode 411, the third drain electrode 412, the first conductive pad 413, the second conductive pad 414, and the third substrate 40.

The third active layer 43 is arranged on a surface of the first insulating layer 421 away from the third source electrode 411 and the third drain electrode 412, and the third active layer 43 is overlapped with the third source electrode 411. The third active layer 43 includes a third source electrode contact area 43b, a third drain electrode contact area 43c, and a third channel area 43a, and the third channel area 43a is located between the third source electrode contact area 43b and the third drain electrode contact area 43c.

The second insulating layer 441 is arranged on a surface of the third active layer 43 away from the first insulating layer 421, and the second insulating layer 441 corresponds to the third channel area 43a of the third active layer 43.

The third gate electrode 45 is arranged on a surface of the second insulating layer 441 away from the third active layer 43, and the third gate electrode 45 corresponds to the third channel area 43a of the third active layer 43.

The third insulating layer 461 covers the first insulating layer 421 and the third gate electrode 45.

Both the first contact hole 46a and the second contact hole 46b go through the third insulating layer 461. The first contact hole 46a corresponds to the third source electrode contact area 43b of the third active layer 43, and the second contact hole 46b corresponds to the drain electrode contact area 43c of the third active layer 43.

Both the third contact hole 46c and the fourth contact hole 46d go through the third insulating layer 461 and the first insulating layer 421. The third contact hole 46c corresponds to the third source electrode 411, and the fourth contact hole 46d corresponds to the third drain electrode 412.

A part of the connecting electrodes is arranged on a surface of the third insulating layer 461 away from the third gate electrode 45, and the connecting electrodes include a first connecting electrode 471 and a second connecting electrode 472 arranged at intervals. The first connecting electrode 471 corresponds to the first contact hole 46a and the third contact hole 46c, and the second connecting electrode 472 corresponds to the second contact hole 46b and the fourth contact hole 46d. The first connecting electrode 471 is in contact with a part of the third active layer 43 corresponding to the third source electrode contact area 43a, and the first connecting electrode 471 is in contact with the third source electrode 411 through the third contact hole 46c. The second connecting electrode 472 is in contact with a part of the third active layer 43 corresponding to the third drain electrode contact area 43c, and the second connecting electrode 472 is in contact with the third drain electrode 412 through the fourth contact hole 46d.

Both the first opening 46e and the second opening 46f go through the third insulating layer 461 and the first insulating layer 421. The first opening 46e corresponds to the first conductive pad 413, and the second opening 46f corresponds to the second conductive pad 414.

The light-emitting device 60 is micro light-emitting diode. The light-emitting device 60 is bonded on the first conductive pad 413 and the second conductive pad 414 through the first opening 46e and the second opening 46f. The third drain electrode 412 is connected to the first conductive pad 413, so that the light-emitting device 60 is electrically connected with a thin film transistor. The thin film transistor includes the third source electrode 411, the third drain electrode 412, the third gate electrode 45, the third active layer 43, and the connecting electrodes.

The description about the foregoing embodiments is merely provided to help understand the method and core ideas of the present disclosure. Persons of ordinary skill in the art should understand that they may still make modifications to the technical solutions described in the foregoing embodiments or make equivalent replacements to some or all technical features thereof, without departing from the scope of the technical solutions of the embodiments of the present disclosure.

What is claimed is:

1. An array substrate, comprising:

a substrate;

a source electrode and a drain electrode arranged on a surface of the substrate;

a first insulating layer covering the source electrode, the drain electrode, and the substrate;

an active layer arranged on a surface of the first insulating layer away from the source electrode and the drain electrode, wherein the active layer comprises a source electrode contact area, a drain electrode contact area, and a channel area, and the channel area is located between the source electrode contact area and the drain electrode contact area;

a second insulating layer arranged on a surface of the active layer away from the first insulating layer and corresponding to the channel area;

a gate electrode arranged on a surface of the second insulating layer away from the active layer and corresponding to the channel area;

a third insulating layer covering the first insulating layer and the gate electrode;

a first contact hole and a second contact hole defined through the third insulating layer, wherein the first contact hole corresponds to the source electrode contact area, and the second contact hole corresponds to the drain electrode contact area;

a third contact hole and a fourth contact hole defined through the third insulating layer and the first insulating layer, wherein the third contact hole corresponds to the source electrode, and the fourth contact hole corresponds to the drain electrode; and connecting electrodes comprising a first connecting electrode and a second connecting electrode arranged at intervals, wherein the first connecting electrode is in contact with the source electrode contact area through the first contact hole, the first connecting electrode is in contact with the source electrode through the third contact hole, the second connecting electrode is in contact with the drain electrode contact area through the second contact hole, and the second connecting electrode is in contact with the drain electrode through the fourth contact hole, wherein an orthographic projection of the gate electrode on the substrate is located within an orthographic projection of the first connecting electrode on the substrate, and the first connecting electrode overlaps the drain electrode contact area.

2. The array substrate according to claim 1, wherein a material of the connecting electrodes comprises a metal oxide.

3. The array substrate according to claim 1, wherein a distance between an edge of the first connecting electrode adjacent to the second connecting electrode and the gate electrode is greater than 2 μm and is less than or equal to 5 μm.

4. The array substrate according to claim 1, wherein a distance between an edge of the first connecting electrode adjacent to the second connecting electrode and an edge of the second connecting electrode adjacent to the first connecting electrode is greater than 0 μm and is less than or equal to 4 μm.

5. The array substrate according to claim 1, wherein the source electrode corresponds to the active layer, and an orthographic projection of the active layer on the substrate is located within an orthographic projection of the source electrode on the substrate.

6. The array substrate according to claim 1, wherein an opening size of the first contact hole is less than an opening size of the third contact hole, and an opening size of the second contact hole is less than an opening size of the fourth contact hole.

7. A display panel, comprising an array substrate, wherein the array substrate comprises:

a substrate;

a source electrode and a drain electrode arranged on a surface of the substrate;

a first insulating layer covering the source electrode, the drain electrode, and the substrate;

an active layer arranged on a surface of the first insulating layer away from the source electrode and the drain electrode, wherein the active layer comprises a source electrode contact area, a drain electrode contact area, and a channel area, and the channel area is located between the source electrode contact area and the drain electrode contact area;

a second insulating layer arranged on a surface of the active layer away from the first insulating layer and corresponding to the channel area;

a gate electrode arranged on a surface of the second insulating layer away from the active layer, and corresponding to the channel area;

a third insulating layer covering the first insulating layer and the gate electrode;

a first contact hole and a second contact hole defined through the third insulating layer, wherein the first contact hole corresponds to the source electrode contact area, and the second contact hole corresponds to the drain electrode contact area;

a third contact hole and a fourth contact hole defined through the third insulating layer and the first insulating layer, wherein the third contact hole corresponds to the source electrode, and the fourth contact hole corresponds to the drain electrode; and connecting electrodes comprising a first connecting electrode and a second connecting electrode arranged at intervals, wherein the first connecting electrode is in contact with the source electrode contact area through the first contact hole, the first connecting electrode is in contact with the source electrode through the third contact hole, the second connecting electrode is in contact with the drain electrode contact area through the second contact hole, and the second connecting electrode is in contact with the drain electrode through the fourth contact hole, wherein an orthographic projection of the gate electrode on the substrate is located within an orthographic projection of the first connecting electrode on the substrate, and the first connecting electrode overlaps with the drain electrode contact area.

8. The display panel according to claim 7, wherein a material of the connecting electrodes comprises a metal oxide.

9. The display panel according to claim 7, wherein a distance between an edge of the first connecting electrode adjacent to the second connecting electrode and the gate electrode is greater than 2 μm and is less than or equal to 5 μm.

10. The display panel according to claim 7, wherein a distance between an edge of the first connecting electrode adjacent to the second connecting electrode and an edge of the second connecting electrode adjacent to the first connecting electrode is greater than 0 μm and is less than or equal to 4 μm.

11. The display panel according to claim 7, wherein the source electrode corresponds to the active layer, and an orthographic projection of the active layer on the substrate is located within an orthographic projection of the source electrode on the substrate.

12. The display panel according to claim 7, wherein an opening size of the first contact hole is less than an opening size of the third contact hole, and an opening size of the second contact hole is less than an opening size of the fourth contact hole.

13. The display panel according to claim 7, wherein the array substrate further comprises a first conductive pad and a second conductive pad, the source electrode, the drain electrode, the first conductive pad, and the second conductive pad are arranged at intervals on the surface of the substrate, the source electrode is arranged adjacent to the drain electrode, the first conductive pad is arranged adjacent to the second conductive pad, and the drain electrode is arranged adjacent to and connected to the first conductive pad.

14. The display panel according to claim 13, wherein the array substrate further defines a first opening and a second opening, both the first opening and the second opening penetrate through the third insulating layer and the first insulating layer, the first opening corresponds to the first conductive pad, and the second opening corresponds to the second conductive pad.

15. The display panel according to claim 14, wherein the display panel further comprises a light-emitting device, the light-emitting device is bonded on the first conductive pad and the second conductive pad through the first opening and the second opening.

* * * * *